US008816573B2

(12) United States Patent
Kobayashi

(10) Patent No.: US 8,816,573 B2
(45) Date of Patent: Aug. 26, 2014

(54) PIEZOELECTRIC VIBRATION PIECE HAVING IMPROVED DRIVE CHARACTERISTICS AND COMPONENTS INCLUDING SAME

(75) Inventor: Takashi Kobayashi, Chiba (JP)

(73) Assignee: SII Crystal Technology Inc., Chiba (JP)

( * ) Notice: Subject to any disclaimer, the term of this patent is extended or adjusted under 35 U.S.C. 154(b) by 507 days.

(21) Appl. No.: 13/197,311

(22) Filed: Aug. 3, 2011

(65) Prior Publication Data

US 2012/0039153 A1 Feb. 16, 2012

(30) Foreign Application Priority Data

Aug. 10, 2010 (JP) ................................. 2010-179510

(51) Int. Cl.
*H01L 41/08* (2006.01)
*H03H 9/21* (2006.01)
*G04R 20/10* (2013.01)

(52) U.S. Cl.
CPC . *H03H 9/21* (2013.01); *G04R 20/10* (2013.01)
USPC ........................................................ 310/370

(58) Field of Classification Search
CPC ............ H03H 9/19; H03H 9/21; H03H 9/215
USPC ........................................................ 310/370
See application file for complete search history.

(56) References Cited

U.S. PATENT DOCUMENTS

| 5,522,249 | A  | * | 6/1996 | Macy ............................. 310/370 |
| 6,959,472 | B2 | * | 11/2005 | Kawashima ................. 29/25.35 |
| 7,067,966 | B2 | * | 6/2006 | Tanaya ........................... 310/367 |
| 7,112,915 | B2 | * | 9/2006 | Tanaya et al. .................. 310/370 |
| 7,564,326 | B2 | * | 7/2009 | Kawashima .................... 310/370 |
| 7,592,741 | B2 | * | 9/2009 | Tanaya et al. .................. 310/370 |
| 7,859,173 | B2 | * | 12/2010 | Ichikawa ........................ 310/370 |
| 7,986,077 | B2 | * | 7/2011 | Yamamoto ..................... 310/370 |
| 8,089,202 | B2 | * | 1/2012 | Kobayashi ..................... 310/370 |
| 8,299,863 | B2 | * | 10/2012 | Tanaya et al. .................. 310/370 |

(Continued)

FOREIGN PATENT DOCUMENTS

| JP | 2002076827 A | * | 3/2002 | ............. H03H 9/215 |
| JP | 2003-087090 A | | 3/2003 | |
| JP | 2005-229143 A | | 8/2005 | |

*Primary Examiner* — Jaydi San Martin
(74) *Attorney, Agent, or Firm* — Brinks, Gilson & Lione

(57) ABSTRACT

A piezoelectric vibration piece that can ensure good drive level characteristics and a piezoelectric vibrator, oscillator, electronic device and radio-controlled timepiece in which the piezoelectric vibration piece is used are provided. The width of the base-end side of the grooves 5 is narrower than that of the tip side of the grooves 5. The base 4 includes: a mount section 4*a* on the outer surface of which mount electrodes 12, 13 are formed to mount the piezoelectric vibration piece 1; and an intermediate section 4*b* that is connected to the mount section 4*a* and the pair of vibrating arms 3*a*, 3*b* so as to be positioned between the mount section 4*a* and the pair of vibrating arms 3*a*, 3*b*, on the outer surface of which leading electrodes 14*a*, 14*b* that connect the pair of excitation electrodes 10, 11 and the mount electrodes 12, 13 are formed. The width of the mount section 4*a* is wider than that of the intermediate section 4*b*. In step parts between the mount section 4*a* and the intermediate section 4*b*, side surfaces of the mount section 4*a* and side surfaces of the intermediate section 4*b* are connected via tilted surfaces 4*c* that tilt with respect to a longitudinal direction.

18 Claims, 13 Drawing Sheets

(56) References Cited

U.S. PATENT DOCUMENTS

| | | | |
|---|---|---|---|
| 8,587,184 B2 * | 11/2013 | Yang et al. .................... 310/370 |
| 2009/0066194 A1 * | 3/2009 | Yamamoto .................... 310/370 |
| 2011/0221311 A1 * | 9/2011 | Iwai .............................. 310/370 |
| 2012/0195170 A1 * | 8/2012 | Kobayashi .................... 310/370 |

* cited by examiner

PIEZOELECTRIC VIBRATION PIECE HAVING IMPROVED DRIVE CHARACTERISTICS AND COMPONENTS INCLUDING SAME

RELATED APPLICATIONS

This application claims priority under 35 U.S.C. §119 to Japanese Patent Application No. 2010-179510 filed on Aug. 10, 2010, the entire content of which is hereby incorporated by reference.

BACKGROUND OF THE INVENTION

1. Field of the Invention

The present invention relates to a piezoelectric vibration piece, a piezoelectric vibrator, an oscillator, an electronic device and a radio-controlled timepiece.

2. Description of the Related Art

In recent years, a piezoelectric vibrator utilizing a crystal or the like has been used for a time source, a timing source for control signals, a reference signal source or the like of a mobile phone or portable information terminal device. Various piezoelectric vibrators of this type have been provided. As one of them, a piezoelectric vibrator having a tuning-fork type piezoelectric vibration piece is known.

By the way, the piezoelectric vibration piece needs to be smaller as the device in which the piezoelectric vibration piece is included becomes smaller. Generally, in order to make the piezoelectric vibration piece smaller while keeping low the CI (crystal impedance) value of the piezoelectric vibrator, a method is known in which a groove is formed in both main surfaces of the vibrating arms of the piezoelectric vibration piece. Furthermore, various proposals have been made for the shape of the groove of the vibrating arms.

For example, JP-A-2003-87090 proposes a vibration piece having: a base in which base electrodes (corresponding to mount electrodes of the invention) are formed; vibrating arms protruding from the base; grooves having groove electrodes (corresponding to excitation electrodes of the invention) formed on the front and/or back surfaces of the vibrating arms; side electrodes (corresponding to the excitation electrodes of the invention) formed on the side surfaces of the vibrating arms in which the grooves of the vibrating arms are not formed; and connection electrodes for side surface electrode (corresponding to leading electrodes of the invention) for connecting the base electrodes and the side electrodes, the opening of the grooves being formed such that the width of the base side is narrower than that of the other portion. Forming the width of the base side of the opening of the grooves narrower can ensure a large area in which the connection electrodes are formed. This is said to prevent the connection electrodes for groove electrode or connection electrodes for side surface electrode from short-circuiting with the groove electrodes or side surface electrodes to cause a defect in the vibration piece while preventing the CI value from increasing.

On the other hand, Japanese Patent No. 4,409,979 proposes that the width of the grooves near the base is gradually decreased in a tapered shape so that the width of the base side of the grooves is narrower than that of the other portion. Compared with the case of forming the grooves such that the width changes steeply as proposed in JP-A-2003-87090, in the case of forming the grooves in a tapered shape as proposed in Japanese Patent No. 4,409,979, etching residue is less likely to occur in the grooves. Thus, gradually decreasing the width of the grooves in a tapered shape allows accurate and stable etching of the grooves. This is said to reduce variation in shape of the left and right grooves to equalize the rigidity of legs and reduce the CI value.

Also, it is known that, when the piezoelectric vibration piece is activated, vibration of the piezoelectric vibration piece leaks to the outside through the base, i.e., what is called vibration leakage (vibration energy leakage) occurs. Since the vibration leakage may lead to increase in the CI value, the vibration leakage needs to be inhibited as much as possible.

One known method for inhibiting the vibration leakage is to form, in the base of the piezoelectric vibration piece, a mount section in which mount electrodes to be mounted outside are formed and an intermediate section located between the mount section and the vibrating arms, such that the mount section has a width wider than that of the intermediate section, and provide a step part to connect the mount section and the intermediate section. Where the characteristics of the vibration leakage depends on the length of the intermediate section in the longitudinal direction of the vibrating arms (hereinafter referred to as "effective value").

The shape of the grooves and the effective value described above cause the CI value and the characteristics of the vibration leakage to vary, causing the vibration mode of the piezoelectric vibration piece to vary, which may influence the drive level characteristics of the piezoelectric vibration piece.

FIG. 15 illustrates the drive level characteristics.

The drive level characteristics refers to a variability characteristics of the vibration frequency with respect to the variation in drive voltage. Specifically, as shown in FIG. 15, when the voltage applied to the piezoelectric vibration piece is increased from V1 to V2, the frequency increases from f0 to f1. Then, when the voltage applied to the piezoelectric vibration piece is returned from V2 to V1, the frequency does not return from f1 to f0, but decreases to f2 lower than f0. The characteristics of this variation in the vibration frequency Δf (difference between f0 and f2) is referred to as the drive level characteristics. Note that, the smaller the amplitude of Δf is, the better the drive level characteristics is considered to be.

According to JP-A-2003-87090 and Japanese Patent No. 4,409,979, the grooves are formed such that the width of the base-end side is narrower than that of the tip side, which increases the rigidity of the base-end side of the vibrating arms that is largely distorted when vibrating. This causes the vibration mode of the piezoelectric vibration piece to vary while keeping the CI value low. Accordingly, this may also cause the drive level characteristics to vary.

By the way, the piezoelectric vibration piece is formed by etching a wafer of quartz. When the step part is provided to connect the mount section and the intermediate section, the amount of etching residue in a corner of the step part varies depending on etching time. Accordingly, the length of the intermediate section, i.e., the effective value varies depending on the etching time, which causes the characteristics of the vibration leakage to vary, causing the vibration mode of the piezoelectric vibration piece to vary. Accordingly, this may also cause the drive level characteristics to vary.

In this way, providing the step part to connect the mount section and the intermediate section causes the effective value to vary depending on the etching time, which limits the improvement of the drive level characteristics.

SUMMARY OF THE INVENTION

In view of the above, an object of the invention is to provide a piezoelectric vibration piece that can ensure good drive level characteristics and a piezoelectric vibrator, oscillator, electronic device and radio-controlled timepiece in which the piezoelectric vibration piece is used.

In order to solve the above object, a piezoelectric vibration piece of the invention includes: a pair of vibrating arms arranged in the width direction; grooves formed on both main surfaces of the vibrating arms from the base-end side in the longitudinal direction of the vibrating arms toward the tip side in the longitudinal direction; excitation electrodes formed on outer surfaces of the vibrating arms and the grooves; and a base to which the base-end side of the pair of vibrating arms is connected, wherein the width of the base-end side of the grooves is narrower than that of the tip side of the grooves, in which the base includes: a mount section on the outer surface of which mount electrodes are formed to mount the piezoelectric vibration piece on the outside; and an intermediate section that is connected to the mount section and the pair of vibrating arms so as to be positioned between the mount section and the pair of vibrating arms, on the outer surface of which leading electrodes that connect the pair of excitation electrodes and the mount electrodes are formed, in which the width of the mount section is wider than that of the intermediate section, and in which, in step parts between the mount section and the intermediate section, side surfaces of the mount section and side surfaces of the intermediate section are connected via tilted surfaces that tilt with respect to the longitudinal direction in plan view.

According to the invention, the width of the base-end side of the grooves formed in the vibrating arms is narrower than that of the tip side of the grooves. This ensures the rigidity of the base-end side of the vibrating arms. Also, in the invention, in the step parts, the mount section and the intermediate section are connected via the tilted surfaces that can be easily aligned with the crystal direction of a wafer, which can reduce variation in the amount of etching residue in the tilted surfaces between the mount section and the intermediate section. This allows accurate forming of the intermediate section. Thus, it is possible to adjust the effective value to an ideal length that provides good drive level characteristics, which can ensure good drive level characteristics. Furthermore, the effective value can be kept to the ideal length to inhibit the vibration leakage.

Also, the ends of the base-end side of the grooves are preferably placed away from the connection of the base and the pair of vibrating arms toward the tip side.

According to the invention, the ends of the base-end side of the grooves are placed away from the connection of the base and the vibrating arms toward the tip side, which can increase the rigidity of the base-end side of the vibrating arms. This can further improve the drive level characteristics.

Also, the width of the base-end side of the vibrating arms is preferably wider than that of the tip side of the vibrating arms.

According to the invention, the width of the base-end side of the vibrating arms is wider than that of the tip side of the vibrating arms, which can further increase the rigidity of the base-end side of the vibrating arms. This can further improve the drive level characteristics.

Also, a piezoelectric vibrator of the invention includes the above-described piezoelectric vibration piece.

According to the invention, the piezoelectric vibrator that can ensure good drive level characteristics can be provided.

An oscillator of the invention includes the above-described piezoelectric vibrator electrically connected to an integrated circuit as an oscillator.

An electronic device of the invention includes the above-described piezoelectric vibrator electrically connected to a timer.

A radio-controlled timepiece of the invention includes the above-described piezoelectric vibrator electrically connected to a filter.

According to the oscillator, the electronic device and the radio-controlled timepiece, including the piezoelectric vibrator capable of ensuring good drive level characteristics allows manufacturing of the oscillator, the electronic device and the radio-controlled timepiece having good quality.

According to the invention, the width of the base-end side of the grooves formed in the vibrating arms is narrower than that of the tip side of the grooves. This ensures the rigidity of the base-end side of the vibrating arms. Also, in the invention, in the step parts, the mount section and the intermediate section are connected via the tilted surfaces that can be easily aligned with the crystal direction of a wafer, which can reduce variation in the amount of etching residue in the tilted surfaces between the mount section and the intermediate section. This allows accurate forming of the intermediate section. Thus, it is possible to adjust the effective value to an ideal length that provides good drive level characteristics, which can ensure good drive level characteristics. Furthermore, the effective value can be kept to the ideal length to inhibit the vibration leakage.

DETAILED DESCRIPTION OF THE PREFERRED EMBODIMENTS

An embodiment of the invention is described below with reference to the drawings.
(Piezoelectric Vibration Piece)

First, a piezoelectric vibration piece is described with reference to the drawings.

Figure 1:
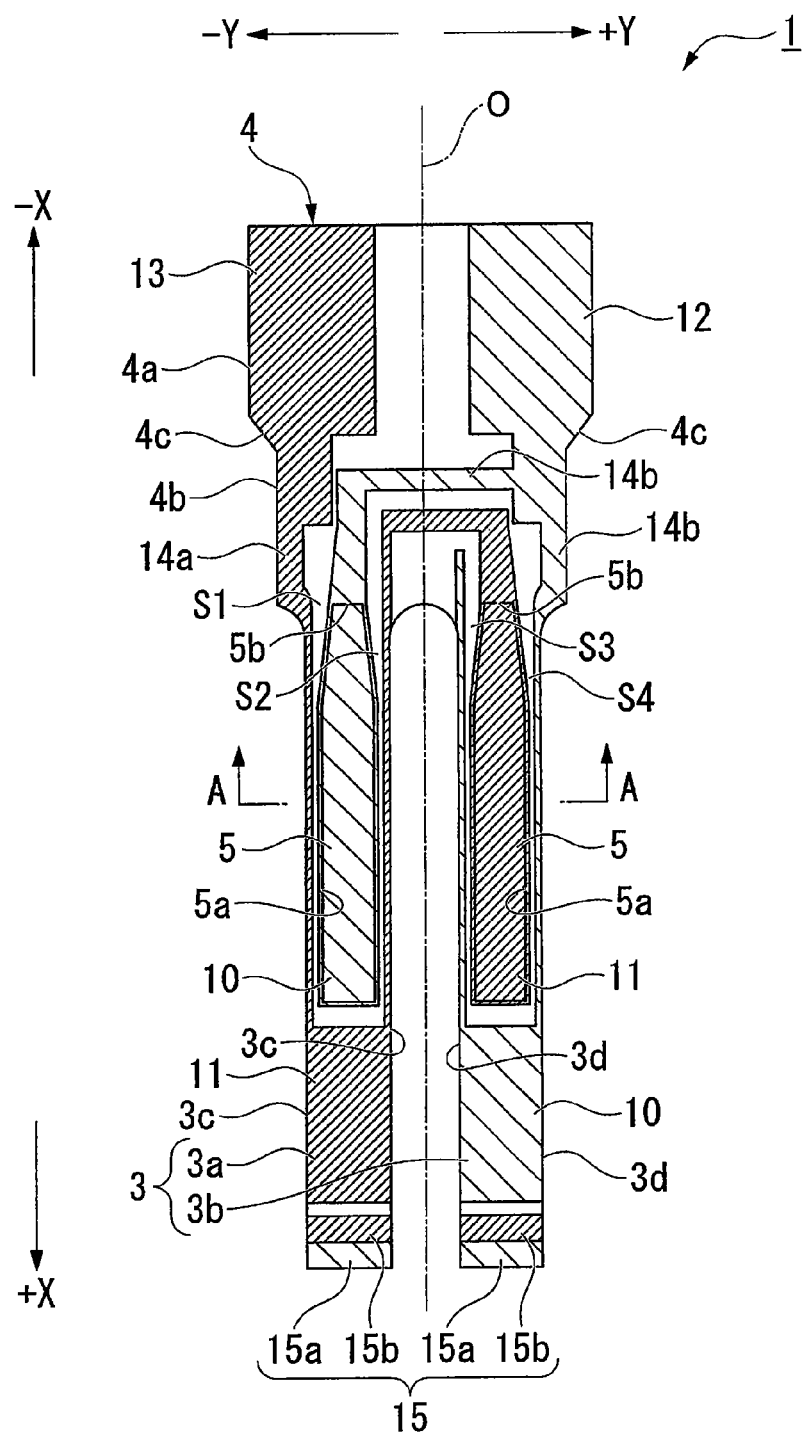
FIG. 1 is a plan view of a piezoelectric vibration piece.

FIG. 1 is a plan view of the piezoelectric vibration piece.

Figure 2:
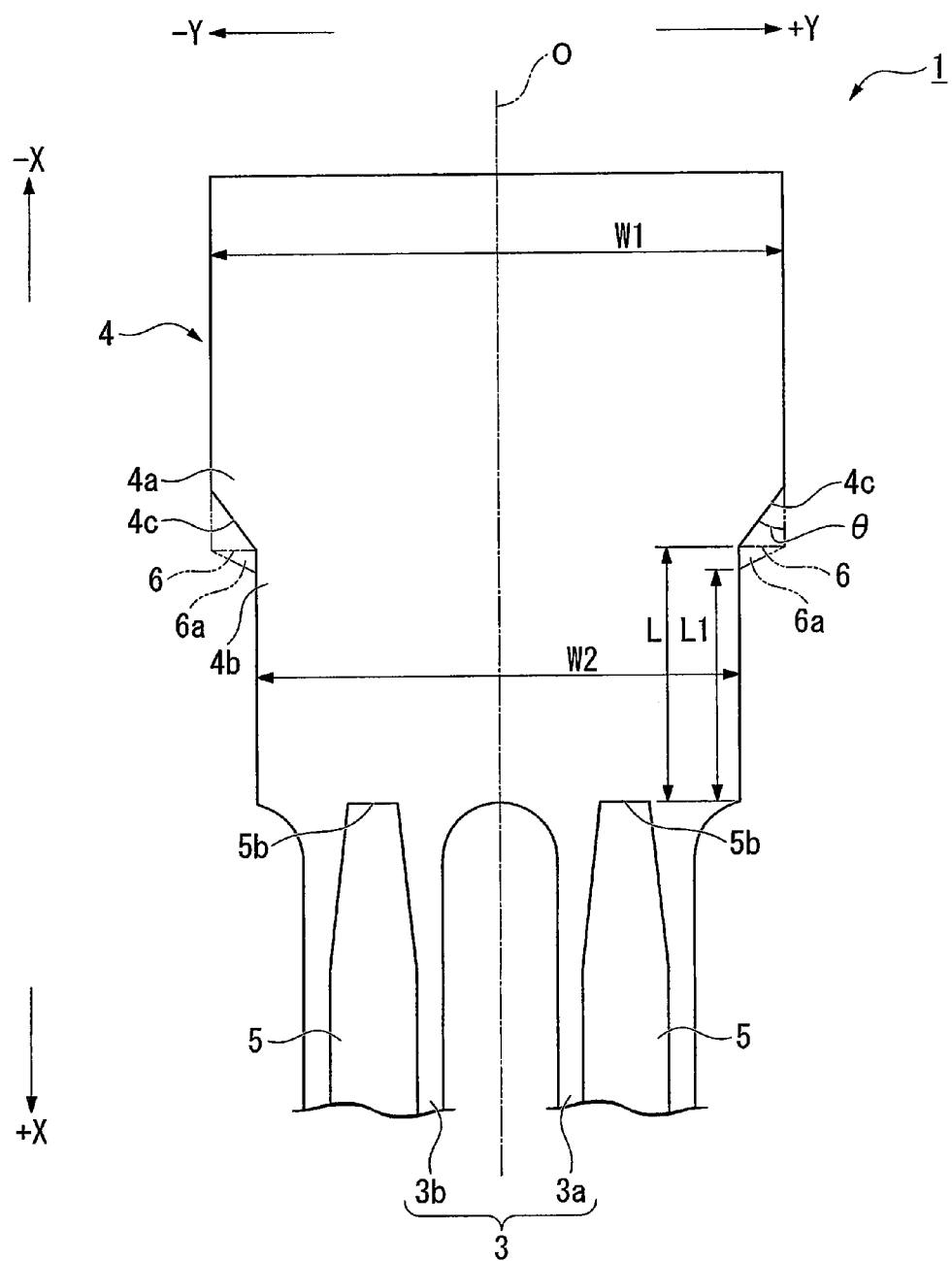
FIG. 2 is an enlarged view of a base of the piezoelectric vibration piece.

FIG. 2 is an enlarged view of a base of the piezoelectric vibration piece.

Figure 3:
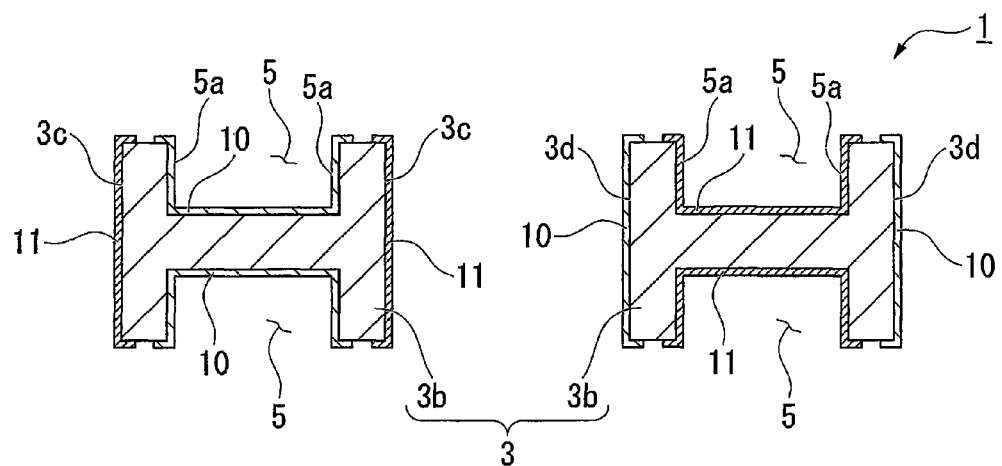
FIG. 3 is a cross-sectional view along the line A-A in FIG. 1.

FIG. 3 is a cross-sectional view along the line A-A in FIG. 1.

Note that, in the following description, an X direction means the longitudinal direction of the piezoelectric vibration piece, a +X side means the tip side, and a –X side means the base-end side. Also, a Y direction means a width direction of the piezoelectric vibration piece, a +Y side means one side of the piezoelectric vibration piece, and a –Y side means the other side.

As shown in FIG. 1, the piezoelectric vibration piece 1 is a tuning-fork type vibration piece formed of a piezoelectric material, such as quartz, lithium tantalate and lithium niobate, which vibrates when a predetermined voltage is applied.

(Vibrating Arms)

As shown in FIG. 1, the piezoelectric vibration piece 1 of the embodiment includes a pair of vibrating arms 3a, 3b. The pair of vibrating arms 3a, 3b extend in the X direction along a center axis O and are arranged in parallel in the Y direction. On the main surfaces (front and back surfaces) of the pair of vibrating arms 3a, 3b, a pair of vertically long grooves 5 are formed from the –X side to the +X side in the X direction of the vibrating arms 3a, 3b.

The grooves 5 are formed along the X direction over the range from the connection of the vibrating arms 3a, 3b and a base 4 to slightly further than the intermediate section of the vibrating arms 3a, 3b. Thus, each of the pair of vibrating arms 3a, 3b has a cross section shape of "H" along the line A-A, as shown in FIG. 3.

Also, the grooves 5 are formed such that the width of the –X-side end is narrower than that of the +X-side end. Specifically, the width of the grooves 5 is constant over about two thirds of the length of the grooves 5 from the +X-side end of the grooves 5. Also, the width of the grooves 5 gradually decreases in a tapered shape from the +X side to the –X side over about one third of the length of the grooves 5 from the –X-side end of the grooves 5.

Forming the –X side of the grooves 5 narrower can ensure large areas S1 to S4 formed between vibrating arm side surfaces 3c, 3d and groove side surfaces 5a near the connection of the vibrating arms 3a, 3b and the base 4. Thus, when leading electrodes 14a, 14b described later are formed in the areas S1 to S4, adjacent excitation electrodes 10, 11 can be reliably prevented from short-circuiting. Also, forming the –X side of the grooves 5 narrower allows increasing of the thickness of the areas S1 to S4 in the Y direction, improving the rigidity of the –X side of the vibrating arms 3a, 3b. This can improve the drive level characteristics as described later while keeping the CI value lower in comparison with the case of forming the grooves 5 with a constant width.

As shown in FIG. 1, the excitation electrodes 10, 11 (a first excitation electrode 10 and a second excitation electrode 11) are formed on the outer surfaces of the vibrating arms 3a, 3b and the grooves 5. For example, the excitation electrodes 10, 11 are formed of a single-layer conductive film of chrome (Cr) or the like. The excitation electrodes 10, 11 are electrodes that cause the vibrating arms 3a, 3b to vibrate at a predetermined resonance frequency in the direction in which the vibrating arms 3a, 3b move close to or away from each other when a voltage is applied. The pair of excitation electrodes 10, 11 are formed by patterning them electrically separated from each other on the surfaces of the pair of the vibrating arms 3a, 3b. Specifically, as shown in FIG. 1, the first excitation electrode 10 is formed mainly in the groove 5 of the vibrating arm 3a on the –Y side and on the side surface of the vibrating arm 3b on the +Y side, and the second excitation electrode 11 is formed mainly in the groove 5 of the vibrating arm 3b on the +Y side and on the side surface of the vibrating arm 3a on the –Y side. As described above, since the areas S1 to S4 are ensured to be large, the adjacent first excitation electrode 10, second excitation electrode 11 and leading electrodes 14a, 14b can be reliably prevented from short-circuiting near the connection of the vibrating arms 3a, 3b and the base 4.

Also, as shown in FIG. 1, in the tip portion of the vibrating arms 3a, 3b, weight metal films 15 including a coarse adjusting film 15a and a fine adjustment film 15b are formed to perform adjustment (frequency adjustment) so that the vibrating arms 3a, 3b vibrate within a predetermined frequency range. The frequency adjustment using the weight metal films 15 allows the frequency of the pair of vibrating arms 3a, 3b to fall into the range of nominal frequency of the device.

(Base)

The base 4, included in the piezoelectric vibration piece 1 of the embodiment, integrally secures the –X side of the pair of vibrating arms 3a, 3b. The base 4 is adjacent to the vibrating arms 3a, 3b. Then, the –X side of the vibrating arms 3a, 3b are connected to the base 4 to support the vibrating arms 3a, 3b.

A mount section 4a is placed on the –X side of the base 4. On the outer surface of the mount section 4a, a pair of mount electrodes 12, 13 are formed. The mount electrodes 12, 13 are a stacked film of chrome and gold formed by forming as underlayer a film of chrome, well adherent to quartz, and then forming as top layer a thin film of gold on the film of chrome. However, this is not a limitation. For example, a film of chrome and nichrome may be formed as underlayer, then a thin film of gold may be further formed as top layer on the film of chrome and nichrome.

Also, an intermediate section 4b is placed in the +X side of the base 4. On the outer surface of the intermediate section 4b, the leading electrodes 14a, 14b that connect the mount electrodes 12, 13 and the excitation electrodes 10, 11 are formed. The leading electrodes 14a, 14b are single layer films formed of chrome as used for the underlayer films of the mount electrodes 12, 13. Thus, the film of the leading electrodes 14a, 14b can be formed at the same time that the underlayer films of the mount electrodes 12, 13 are formed. However, this is not a limitation. For example, the film of the leading electrodes 14a, 14b may be formed of nickel, aluminum, titanium or the like.

Also, as shown in FIG. 2, the mount section 4a has a width W1 wider than a width W2 of the intermediate section 4b. Accordingly, in the connection of the mount section 4a and the intermediate section 4b, the side surfaces along the X direction of the mount section 4a and the end along the Y direction of the intermediate section 4b intersect with each other to form step parts 6. Here, in the embodiment, the step parts 6 are tapered to form tilted surfaces 4c with a tilt angle of θ with respect to the X direction. The tilt angle θ is set to within the range from 30° to 60° that can be easily aligned with the crystal direction of a wafer. In the embodiment, the tilt angle θ is set to 45°. This allows the tilt angle to be more aligned with the crystal direction of the wafer. This can reduce variation in the amount of etching residue even if etching time varies as described later. Thus, the length of the intermediate section 4b can be adjusted to more constant length, allowing the influence of vibration leakage on the characteristics to be more stable.

The reason for forming the tilted surfaces 4c is as follows.

The piezoelectric vibration piece 1 is formed by etching a wafer of quartz. In the etching process, an attempt to form the step parts 6 may lead to causing etching residues 6a in the corner of the step parts 6. Specifically, in the etching process, an etching protection film formed according to the outer shape of the piezoelectric vibration piece is used as mask to selectively remove the unmasked area. As time elapses, the etching progresses to form the corner of the step parts 6 according to the shape of the mask. However, the side surfaces of the +X side of the mount section 4a that form the step parts 6 are generally orthogonal to the X direction and are not aligned with the crystal direction of the wafer, which inhibits the progress of etching. This causes much amount of etching residues 6a in the corner of the step parts 6 when the etching time is short or causes some amount of etching residues 6a in the corner of the step parts 6 when the etching time is long.

As described above, variation in the amount of the etching residues 6a causes an effective value L to vary. Particularly, since the amount of the etching residues 6a depends on the etching time, the effective value L to be obtained depends on the etching time. This causes difficulty in adjusting the length of the intermediate section 4b to a constant length, causing the problem in which the influence of vibration leakage on the characteristics is unstable. Then, when the characteristics of the vibration leakage varies due to variation in the effective value L, the vibration mode of the piezoelectric vibration piece 1 also varies, then the drive level characteristics also varies. In this way, when the effective value L varies to result in an effective value L1 different from a targeted effective value L, the drive level characteristics may become worse.

Figure 4:
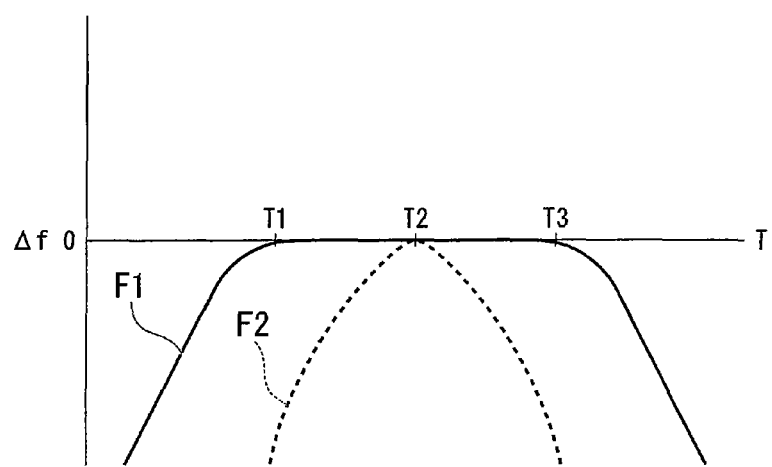
FIG. 4 is a graph showing the relation between etching time and drive level characteristics.

FIG. 4 is a graph showing the relation between the etching time and the drive level characteristics.

In FIG. 4, F1 is a graph of the drive level characteristics when the tilted surfaces 4c are provided in the step parts 6 (in the embodiment), and F2 is a graph of the drive level characteristics when the tilted surfaces 4c are not provided in the step parts 6 (in the conventional art). T is the etching time, and $\Delta f$ is the variation in the vibration frequency. Note that, the smaller the absolute value of $\Delta f$ is, the better the drive level characteristics is.

In the conventional art, variation in the etching time T causes the effective value L to vary. Thus, a drive level characteristics F2 for the conventional art provides an optimum effective value L and good drive level characteristics only at a certain etching time T2. So, when the etching time deviates from the certain etching time T2, $\Delta f$ becomes large in the negative direction to make the drive level characteristics worse.

On the other hand, in the embodiment, since the step parts 6 are tapered, the mount section 4a and the intermediate section 4b are connected via the tilted surfaces 4c that can be easily aligned with the crystal direction of the wafer. Accordingly, how the tilted surfaces 4c are formed between the mount section 4a and the intermediate section 4b is less influenced by variation in the etching time. That is, the tilt angle of the tilted surfaces 4c is less dependent on whether the etching time is long or short, which can reduce variation in the amount of etching residue due to variation in the etching time. Thus, a drive level characteristics F1 for the embodiment provides an optimum effective value L and good drive level characteristics over a wide range of the etching time from T1 to T3. Thus, forming the tilted surfaces 4c provides good drive level characteristics. For the above reason, the step parts 6 are tapered to form the tilted surfaces 4c.

According to the embodiment, as shown in FIG. 1, the width of –X side of the grooves 5 formed in the vibrating arms 3a, 3b is narrower than that of +X side of the grooves 5. This ensures the rigidity of the –X side of the vibrating arms 3a, 3b. Also, in the invention, as shown in FIG. 2, in the step parts 6, the mount section 4a and the intermediate section 4b are connected via the tilted surfaces 4c that can be easily aligned with the crystal direction of the wafer, which can reduce variation in the amount of etching residue in the tilted surfaces 4c between the mount section 4a and the intermediate section 4b. This allows accurate forming of the intermediate section 4b. Thus, it is possible to adjust the effective value L to an ideal length that provides good drive level characteristics while ensuring the rigidity of the –X side of the vibrating arms 3a, 3b, which can ensure good drive level characteristics. Furthermore, variation in the effective value L due to the etching time can be inhibited to keep the effective value L to the ideal length, which can effectively inhibit the vibration leakage.

(First Variation of the Embodiment, Changing the End Position in the Base-end Side of the Grooves)

Next, a first variation of the embodiment is described.

Figure 5:
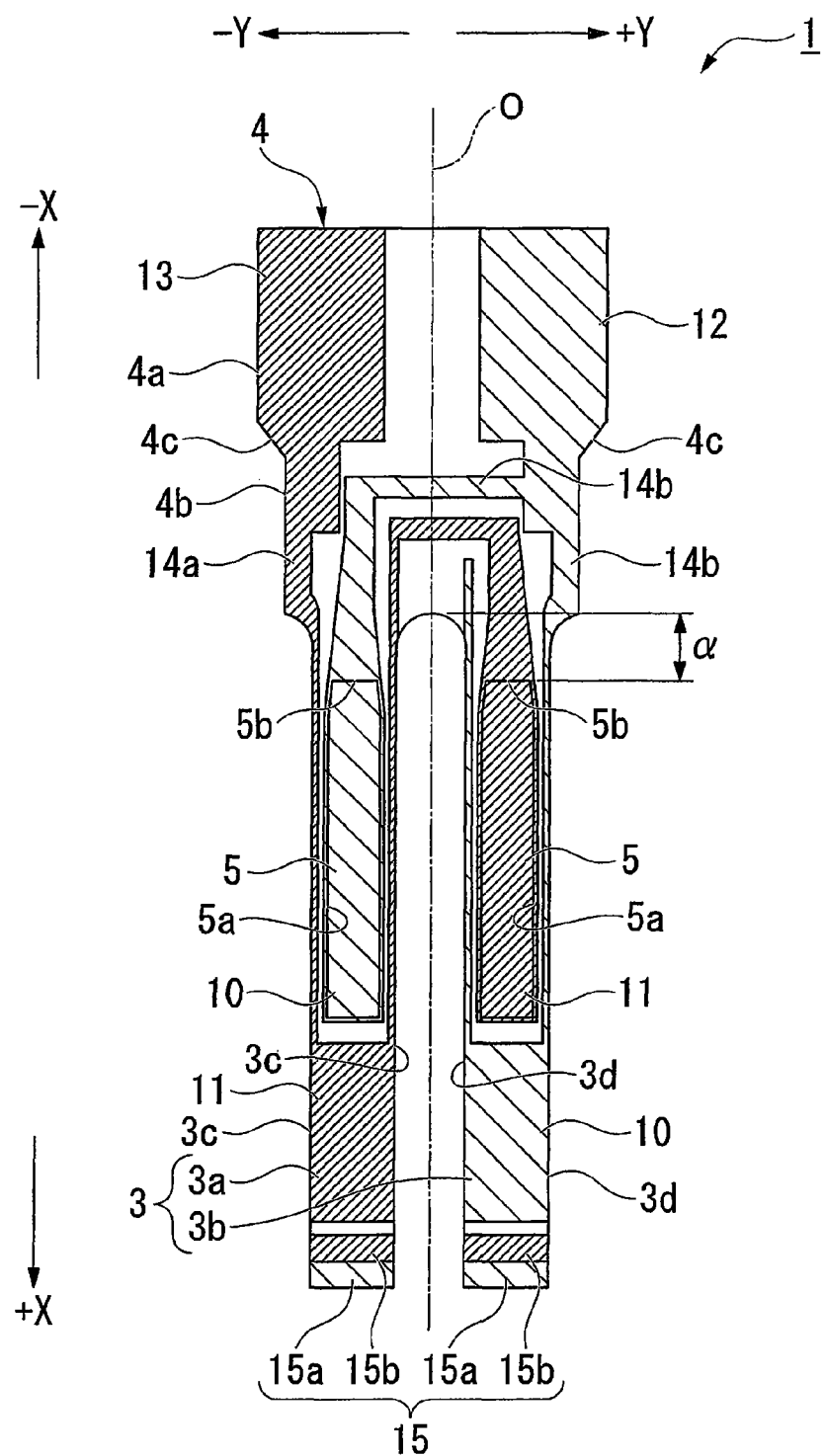
FIG. 5 is a plan view of the piezoelectric vibration piece of a first variation.

FIG. 5 illustrates the first variation of the embodiment.

In the above-described embodiment, ends 5b of the –X side of the grooves 5 are placed near the connection of the base 4 and the vibrating arms 3a, 3b (see FIG. 1). On the other hand, the first variation is different in that, as shown in FIG. 5, the ends 5b of the –X side of the grooves 5 are placed slightly away from the connection of the base 4 and the vibrating arms 3a, 3b toward the +X side. The configuration except the grooves 5 is identical with that of the above-described embodiment and thus is not described here.

In the first variation, the ends 5b of the –X side of the grooves 5 are placed slightly away from the connection of the base 4 and the vibrating arms 3a, 3b toward the +X side. Specifically, as shown in FIG. 5, the ends 5b of the –X side of the grooves 5 are placed a distance of $\alpha$ away from the connection of the base 4 and the vibrating arms 3a, 3b toward the +X side. Thus, within the distance of $\alpha$ from the connection of the base 4 and the vibrating arms 3a, 3b toward the +X side, the grooves 5 are not formed, so the thickness of the vibrating arms 3a, 3b can be surely increased in the Y direction and the thickness direction. This can increase the rigidity of the vibrating arms 3a, 3b within the distance of a compared with the case in which the grooves 5 are formed in the –X side of the vibrating arms 3a, 3b. Thus, it is possible to adjust the effective value L to a length that can ensure good drive level characteristics while further ensuring the rigidity of the –X side of the vibrating arms 3a, 3b, which can further improve the drive level characteristics.

(Second Variation of the Embodiment, Changing the Shape of the Base-end Side of the Vibrating Arms)

Next, a second variation of the embodiment is described.

Figure 6:
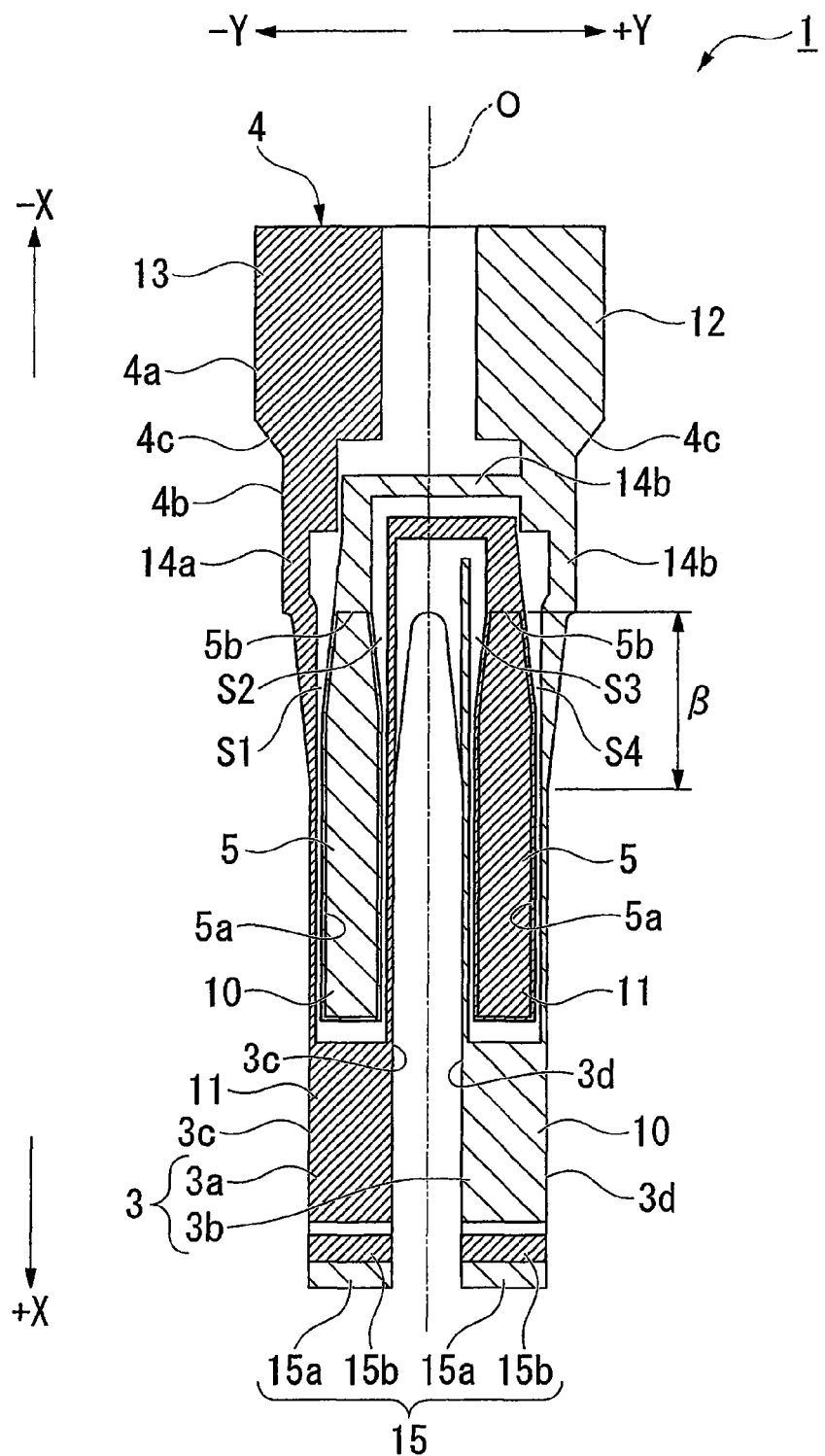
FIG. 6 is a plan view of the piezoelectric vibration piece of a second variation.

FIG. 6 illustrates the second variation of the embodiment.

In the above-described embodiment, the vibrating arms 3a, 3b have a generally constant width (see FIG. 1). On the other hand, the second variation is different in that, as shown in FIG. 6, the width of the –X side of the vibrating arms 3a, 3b is wider than that of the +X side. The configuration except the vibrating arms 3a, 3b is identical with that of the above-described embodiment and thus is not described here.

In the second variation, within a distance of $\beta$ from the connection of the base 4 and the vibrating arms 3a, 3b toward the +X side, the vibrating arms 3a, 3b are formed such that the width gradually increases from the +X side to the –X side. Thus, forming the vibrating arms 3a, 3b such that the width of –X side is wider than that of the +X side allows improving of the rigidity of the vibrating arms 3a, 3b within the distance of $\beta$. Thus, it is possible to adjust the effective value L to a length that can ensure good drive level characteristics while further ensuring the rigidity of the –X side of the vibrating arms 3a, 3b, which can further improve the drive level characteristics.

(Third Variation of the Embodiment, Step-shaped Grooves)

Next, a third variation of the embodiment is described.

Figure 7:
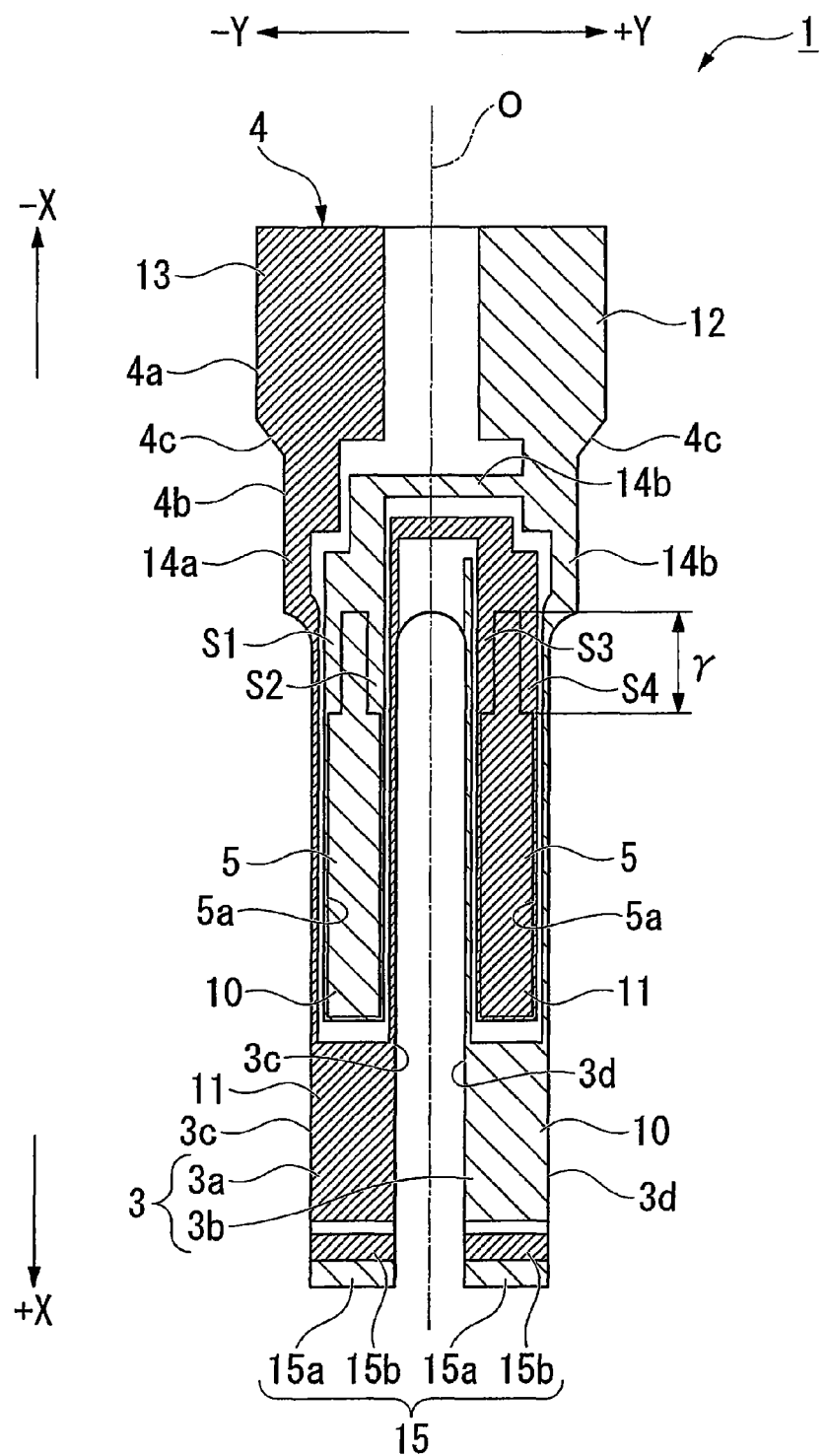
FIG. 7 is a plan view of the piezoelectric vibration piece of a third variation.

FIG. 7 illustrates the third variation of the embodiment.

In the above-described embodiment, the width of the grooves 5 is gradually decreased in a tapered shape so that the width of the –X side of the grooves 5 is narrower than that of the other portion. On the other hand, the third variation is different in that, as shown in FIG. 7, the width of the –X side of the grooves 5 is decreased in a step shape from a predetermined position. The configuration except the shape of the grooves 5 is identical with that of the above-described embodiment and thus is not described here.

In the third variation, the grooves 5 are formed such that the width of the −X side sharply decreases in a step shape from the position a distance of γ away from the connection of the base 4 and the vibrating arms 3a, 3b toward the +X side. Decreasing the width of the grooves 5 in a step shape in this way provides the same effect as gradually decreasing the width of the grooves 5 of the embodiment in a tapered shape. That is, forming the −X side of the grooves 5 narrower can ensure large areas S1 to S4 formed between the vibrating arm side surfaces 3c, 3d and the groove side surfaces 5a near the connection of the vibrating arms 3a, 3b and the base 4. Also, the thickness of the areas S1 to S4 in the Y direction can be increased to improve the rigidity of the −X side of the vibrating arms 3a, 3b. This can improve the drive level characteristic while keeping the CI value lower in comparison with the case of forming the grooves 5 with a constant width.

(Piezoelectric Vibrator)

Next, a piezoelectric vibrator in which the piezoelectric vibration piece of the embodiment is used is described.

Figure 8:
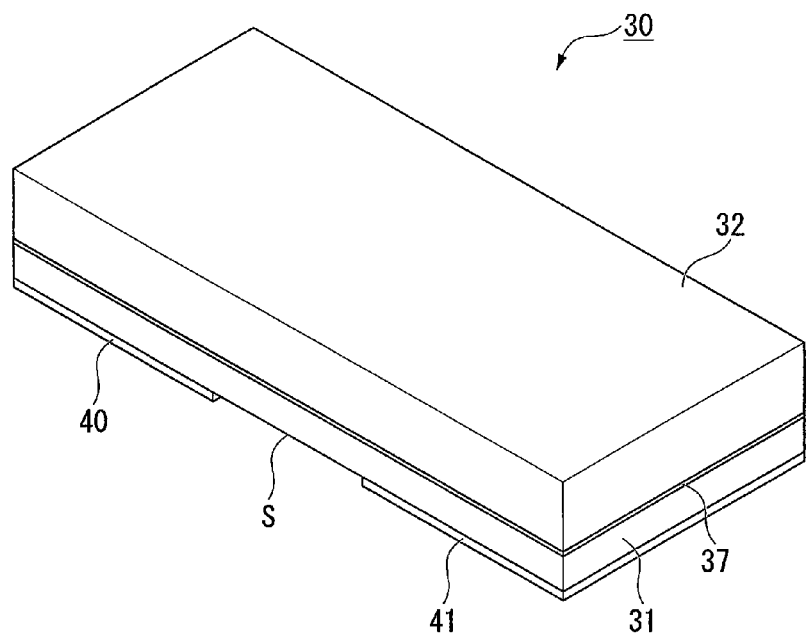
FIG. 8 is a perspective view of an appearance of the piezoelectric vibrator.

FIG. 8 is a perspective view of an appearance of the piezoelectric vibrator.

Figure 9:
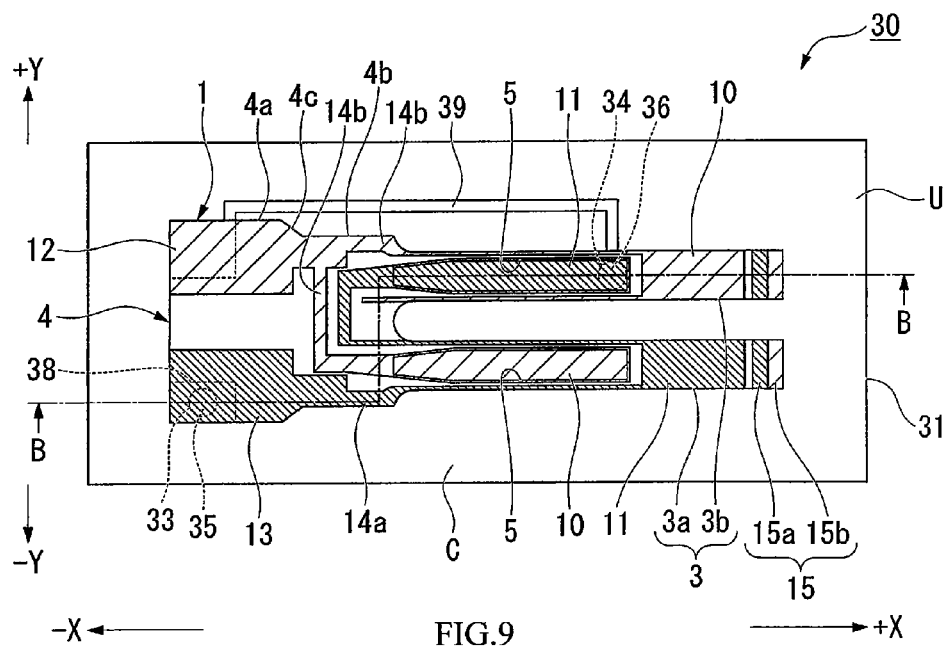
FIG. 9 is an internal configuration diagram of the piezoelectric vibrator showing a plan view with a lid substrate removed.

FIG. 9 is an internal configuration diagram of the piezoelectric vibrator showing a plan view with a lid substrate removed.

Figure 10:
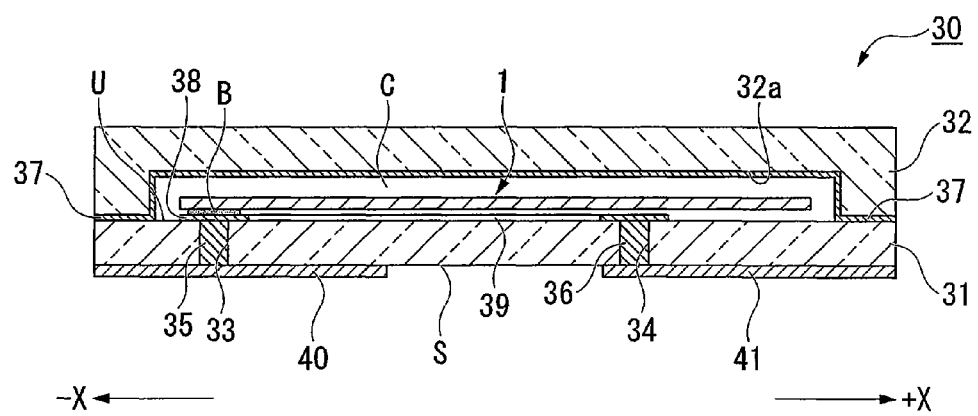
FIG. 10 is a cross-sectional view along the line B-B in FIG. 9.

FIG. 10 is a cross-sectional view along the line B-B in FIG. 9.

Figure 11:
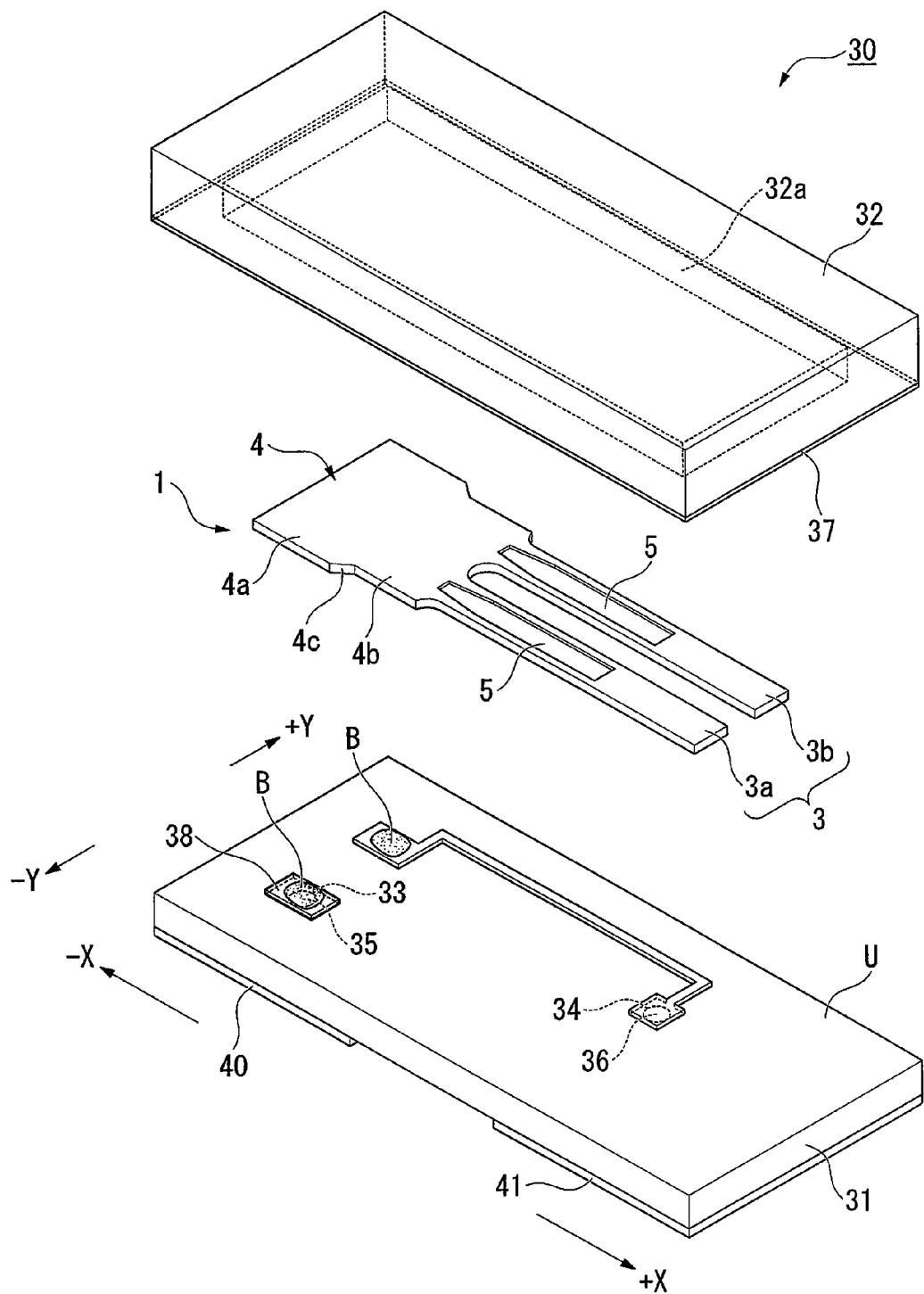
FIG. 11 is an exploded perspective view of the piezoelectric vibrator.

FIG. 11 is an exploded perspective view of the piezoelectric vibrator shown in FIG. 8.

In the following description, a surface of a base substrate 31 to be bonded to a lid substrate 32 is referred to as a first surface U, and an outer surface of the base substrate 31 is referred to as a second surface S. Also, in FIG. 11, the excitation electrodes 10, 11, the leading electrodes 14a, 14b, the mount electrodes 12, 13 and the weight metal films 15 are not shown for simplicity.

As shown in FIGS. 8 to 11, the piezoelectric vibrator 30 of the embodiment is a surface mount type piezoelectric vibrator 30 including: a package into which the base substrate 31 and the lid substrate 32 are anodically bonded with a bonding film 37 in between; and the piezoelectric vibration piece 1 contained in a cavity C of the package.

As shown in FIGS. 8, 10 and 11, the base substrate 31 and the lid substrate 32 are anodically-bondable substrates of a glass material, e.g., soda-lime glass, that is formed generally in a plate shape. A concave portion for cavity 32a for containing the piezoelectric vibration piece 1 is formed in the lid substrate 32 on the side to be bonded to the base substrate 31.

The bonding film 37 for anodic bonding is formed on the whole surface of the lid substrate 32 on the side to be bonded to the base substrate 31. That is, the bonding film 37 is formed on the whole inner surface of the concave portion for cavity 32a as well as on the frame area around the concave portion for cavity 32a. Although the bonding film 37 of the embodiment is formed of silicon film, the bonding film 37 may be formed of aluminum (Al), Cr or the like. As described later, the bonding film 37 and the base substrate 31 are anodically bonded to vacuum-seal the cavity C.

As shown in FIG. 10, the piezoelectric vibrator 30 includes through electrodes 35, 36 that pass through the base substrate 31 in the thickness direction to electrically connect the inside of the cavity C and the outside of the piezoelectric vibrator 30. The through electrodes 35, 36 are placed in through holes 33, 34 that pass through the base substrate 31.

The through holes 33, 34 have a circular-shaped cross-section in the direction perpendicular to their center axis. Also, as shown in FIGS. 9 and 10, the through holes 33, 34 fall within the cavity C when the piezoelectric vibrator 30 is formed. More specifically, of the through holes 33, 34, one through hole 33 is formed at a position corresponding to the base 4 side of the piezoelectric vibration piece 1, and the other through hole 34 is formed at a position corresponding to the +X side of the vibrating arms 3a, 3b.

For example, the through electrodes 35, 36 are formed by inserting metallic pins (not shown) into the through holes 33, 34, then filling glass frit between the through holes 33, 34 and the metallic pins, and then firing the glass frit. Thus, the through holes 33, 34 can be completely filled with the metallic pins and the glass frit, so the through electrodes 35, 36 are responsible for electrically connecting routing electrodes 38, 39 and external electrodes 40, 41 described later while maintaining airtight condition in the cavity C.

As shown in FIGS. 9 to 11, the pair of routing electrodes 38, 39 are patterned on the first surface U of the base substrate 31. Of the pair of routing electrodes 38, 39, one routing electrode 38 is formed so as to position directly above one through electrode 35. On the other hand, the other routing electrode 39 is formed so as to be routed from a position adjacent the one routing electrode 38 toward the +X side along the vibrating arms 3a, 3b and then position directly above the other through electrode 36.

Then, bumps B of gold or the like in a tapered shape are formed on the pair of the routing electrodes 38, 39, and the pair of mount electrodes 12, 13 of the piezoelectric vibration piece 1 are mounted using the bumps B. This electrically connects one mount electrode 13 of the piezoelectric vibration piece 1 to one through electrode 35 via one routing electrode 38, and electrically connects the other mount electrode 12 to the other through electrode 36 via the other routing electrode 39.

Also, the pair of external electrodes 40, 41 are formed on the second surface S of the base substrate 31. The pair of external electrodes 40, 41 are formed at both ends in the X direction of the base substrate 31 and electrically connected to the pair of through electrodes 35, 36.

In order to activate the piezoelectric vibrator 30 configured in this way, a predetermined drive voltage is applied to the external electrodes 40, 41 formed on the base substrate 31. The voltage can be applied to the first excitation electrode 10 and the second excitation electrode 11 of the piezoelectric vibration piece 1 to cause the pair of vibrating arms 3a, 3b to vibrate at a predetermined frequency in the direction in which the vibrating arms 3a, 3b move close to or away from each other. Then, using the vibration of the pair of vibrating arms 3a, 3b allows the piezoelectric vibrator 30 to be used for a time source, a timing source for control signals, a reference signal source or the like (Oscillator)

Next, an oscillator in accordance with an embodiment of the invention is described with reference to FIG. 12.

Figure 12:
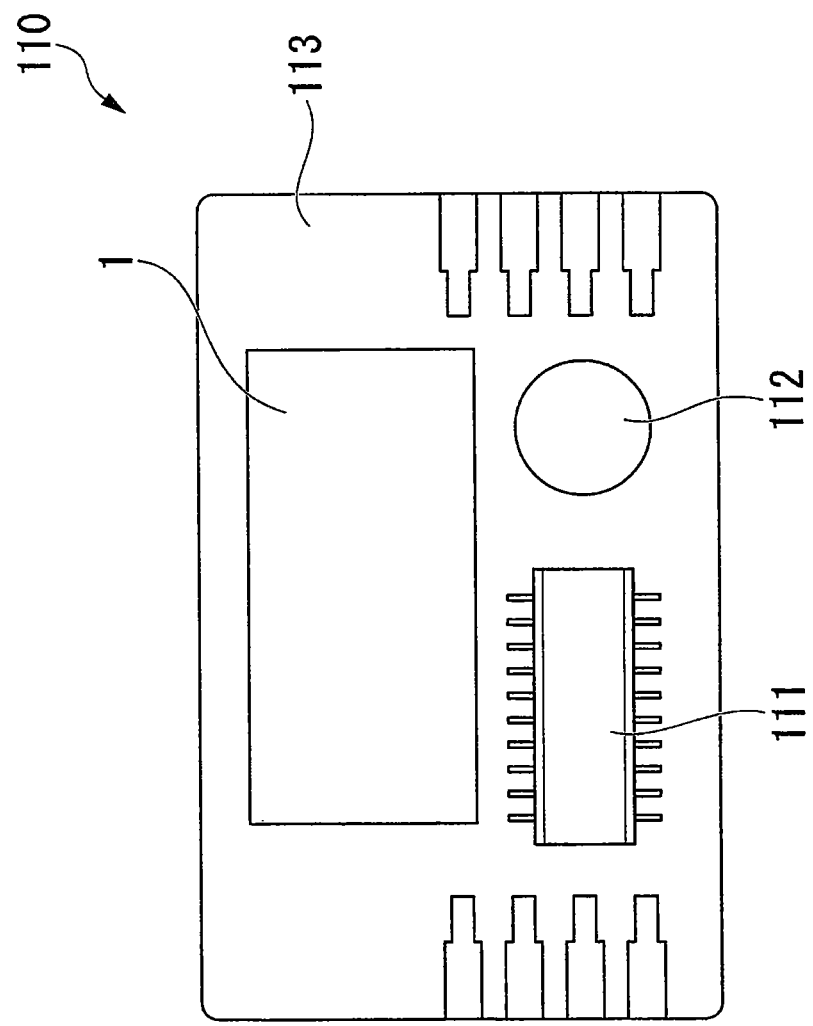
FIG. 12 is a configuration diagram showing an embodiment of an oscillator.

As shown in FIG. 12, the oscillator 110 of the embodiment includes the piezoelectric vibrator 30 configured as an oscillator electrically connected to an integrated circuit 111. The oscillator 110 includes a circuit board 113 on which an electronic device component 112 such as a capacitor is mounted. The board 113 includes the integrated circuit for oscillator 111 mounted thereon, and the piezoelectric vibration piece of the piezoelectric vibrator 30 is mounted near the integrated circuit 111. The electronic device component 112, the integrated circuit 111 and the piezoelectric vibrator 30 are electrically connected via a wiring pattern not shown. Note that these components are molded with a resin not shown.

In the oscillator 110 configured in this way, when a voltage is applied to the piezoelectric vibrator 30, the piezoelectric vibration piece in the piezoelectric vibrator 30 vibrates. This vibration is converted to an electric signal according to piezoelectric characteristics of the piezoelectric vibration piece. The electric signal is input to the integrated circuit 111. The input electric signal is subjected to various processing in the integrated circuit 111 and output as a frequency signal. Thus, the piezoelectric vibrator 30 functions as the oscillator.

Also, selective setting on demand of the configuration of the integrated circuit 111, e.g., a real time clock (RTC) module etc., allows addition of the function of controlling date and time of activation of the device in question or an external device or of providing time information, calendar information and the like, to the function as a single-function oscillator for timepiece.

According to the oscillator 110 of the embodiment, including the piezoelectric vibrator 30 capable of ensuring good drive level characteristics allows manufacturing of the oscillator 110 having good quality.

(Electronic Device)

Figure 13:
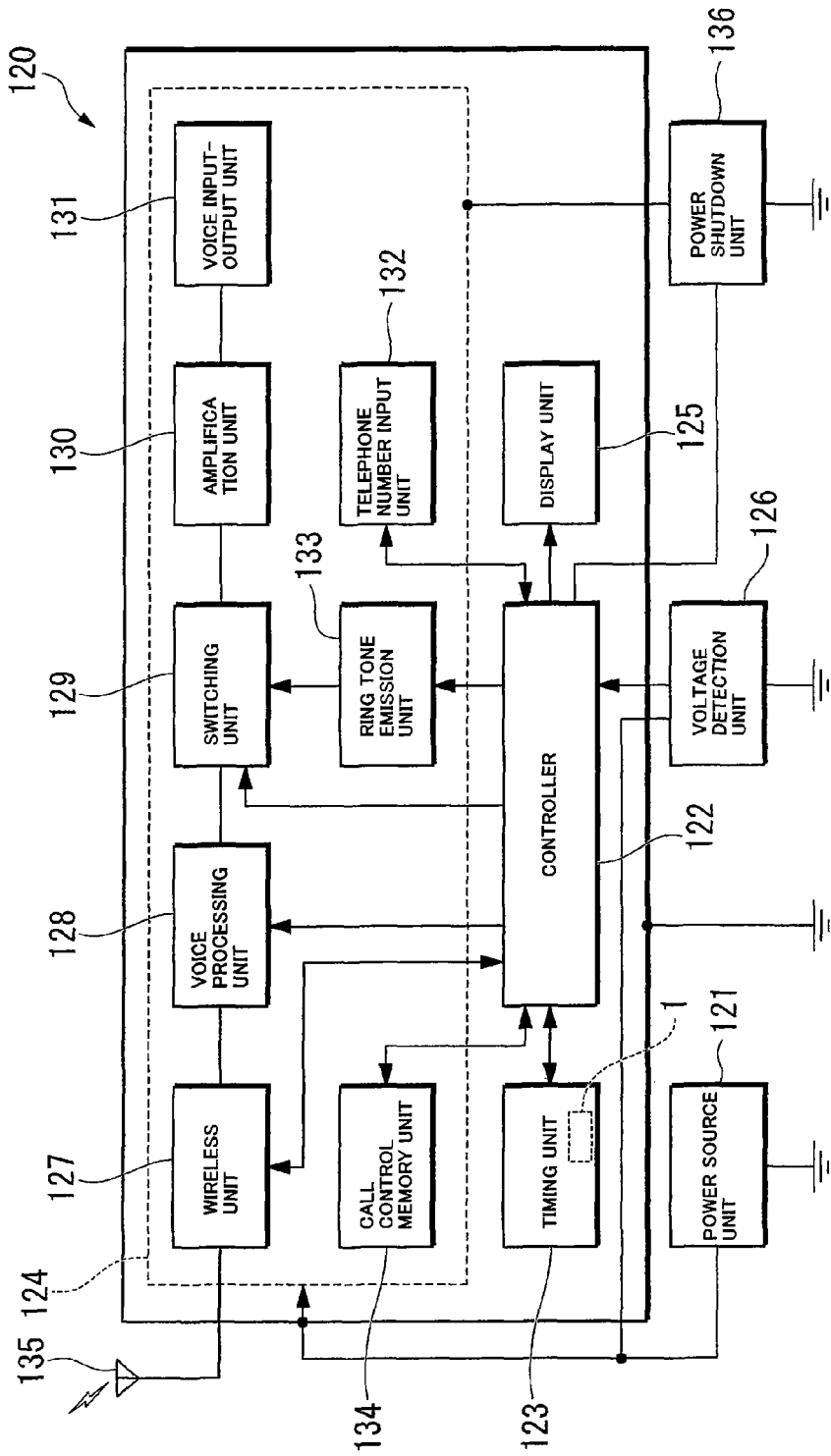
FIG. 13 is a configuration diagram showing an embodiment of an electronic device.

Next, an electronic device in accordance with an embodiment of the invention is described with reference to FIG. 13. As an example of the electronic device, a portable information device 120 including the above-described piezoelectric vibrator 30 is described.

The portable information device 120 of the embodiment is formed by extending and improving the capability of a wristwatch in conventional art and represented by, for example, a mobile phone. The portable information device 120 has an appearance similar to the wristwatch and includes a liquid crystal display in a portion corresponding to a timepiece face, on the screen of which current time and the like can be displayed. Also, in using the device 120 as communication device, the same level of communication as the mobile phone in conventional art can be performed by removing the device 120 from the wrist and using a speaker and microphone built into the inside of the band. However, the device 120 is much smaller and lighter than the conventional mobile phone.

Next, the configuration of the portable information device 120 of the embodiment is described. As shown in FIG. 13, the portable information device 120 includes the piezoelectric vibrator 30 and a power supply 121 for supplying power. The power supply 121 includes a lithium secondary cell, for example. To the power supply 121, a controller 122 for performing various controls, a timer 123 for counting time or the like, a communication section 124 for communicating with the outside, a display 125 for displaying various information and a voltage detector 126 for detecting voltage of these function sections are connected in parallel. Then, these function sections are supplied with power from the power supply 121.

The controller 122 controls the function sections to perform system-wide operation control including transmitting/receiving sound data and measuring/displaying current time. Also, the controller 122 includes a ROM in which a program is previously written, a CPU for reading and executing the program written in the ROM, a RAM used as work area for the CPU and the like.

The timer 123 includes the integrated circuit including oscillator, register, counter and interface circuits and the like, and the piezoelectric vibrator 30. When a voltage is applied to the piezoelectric vibrator 30, the piezoelectric vibration piece vibrates, then the vibration is converted to an electric signal according to piezoelectric characteristics of the crystal, and then the electric signal is input to the oscillator circuit. The output of the oscillator circuit is binarized and counted by the resister and counter circuits. Then, signal transmission/reception is performed with the controller 122 via the interface circuit, and the current time, current date or calendar information and the like are displayed on the display 125.

The communication section 124 has the same level of function as the conventional mobile phone and includes a wireless transmitter/receiver 127, a sound processor 128, a switcher 129, an amplifier 130, a sound input/output section 131, a telephone number input section 132, a ring tone generator 133 and a call control memory 134.

The wireless transmitter/receiver 127 transmits/receives various data including sound data to/from a base station via an antenna 135. The sound processor 128 encodes/decodes a sound signal input from the wireless transmitter/receiver 127 or the amplifier 130. The amplifier 130 amplifies a signal input from the sound processor 128 or the sound input/output section 131 to a predetermined level. The sound input/output section 131, including a speaker, a microphone and the like, amplifies a ring tone or a received sound and collects a sound.

The ring tone generator 133 generates a ring tone in response to a call from the base station. The switcher 129, only when a call is incoming, switches the connection of the amplifier 130 from the sound processor 128 to the ring tone generator 133 to cause a ring tone generated by the ring tone generator 133 to be output to the sound input/output section 131 through the amplifier 130.

The call control memory 134 stores a program relating to outgoing/incoming call control in the communication. The telephone number input section 132 includes number keys such as 0 to 9 and the other keys. By pressing these number keys or the like, the telephone number of a called party or the like is input.

When a voltage applied by the power supply 121 to the function sections including the controller 122 falls below a predetermined value, the voltage detector 126 detects the voltage drop and notifies the controller 122. The predetermined value is a value preset as a minimum voltage required for stable operation of the communication section 124, for example, about 3 V. When notified of the voltage drop by the voltage detector 126, the controller 122 stops the operation of the wireless transmitter/receiver 127, the sound processor 128, the switcher 129 and the ring tone generator 133. Especially, stopping the operation of the wireless transmitter/receiver 127 that consumes much power is essential. Furthermore, the display 125 displays a message that the communication section 124 is inoperable due to insufficient battery power.

Thus, the voltage detector 126 and the controller 122 can stop the operation of the communication section 124 and display a message of this operation stop on the display 125. This message may be a text message or may be an "x" marked on a telephone icon shown in the upper portion of the screen of the display 125 for more intuitive display.

Note that, by including a power supply interrupter 136 that can selectively cut off power for a portion relating to the function of the communication section 124, the function of the communication section 124 can be more reliably stopped.

According to the portable information device 120 of the embodiment, including the piezoelectric vibrator 30 capable of ensuring good drive level characteristics allows manufacturing of the portable information device 120 having good quality.

(Radio-controlled Timepiece)

Next, a radio-controlled timepiece in accordance with an embodiment of the invention is described with reference to FIG. 14.

Figure 14:
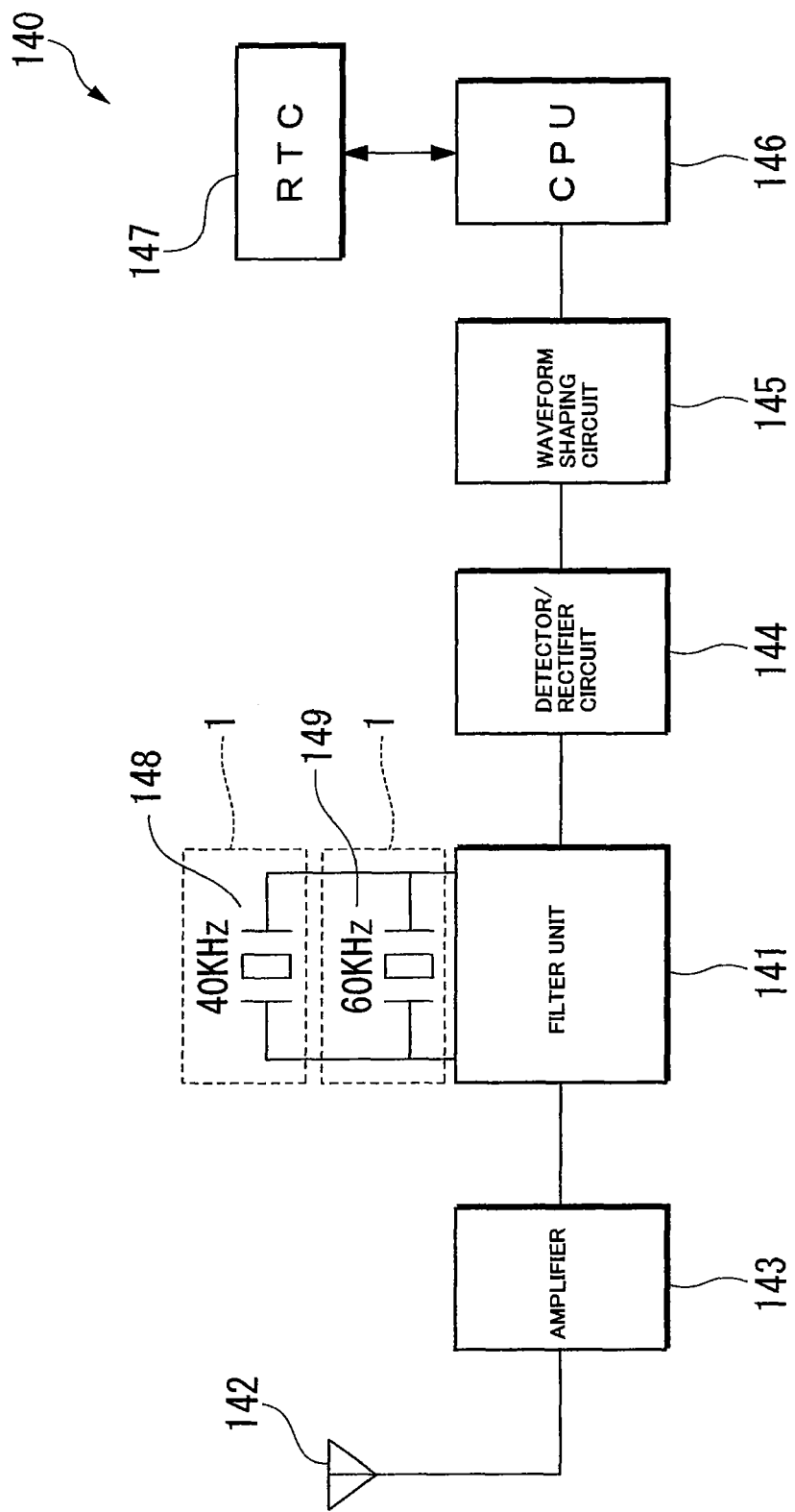
FIG. 14 is a configuration diagram showing an embodiment of a radio-controlled timepiece.
Figure 15:
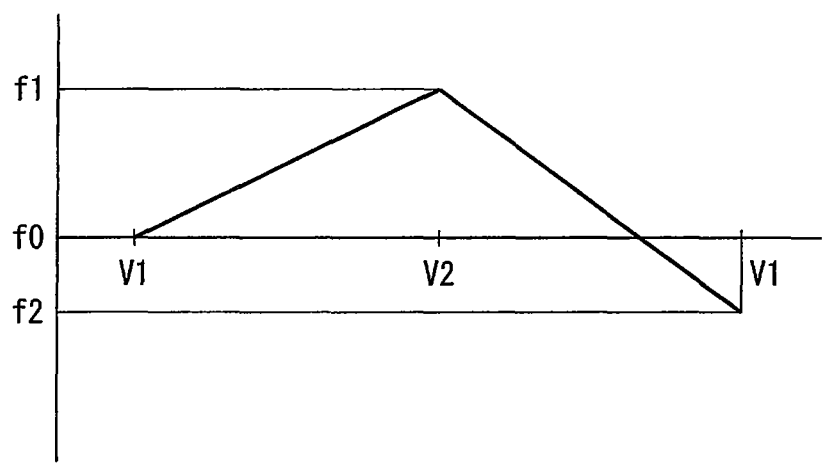
FIG. 15 illustrates the drive level characteristics.

As shown in FIG. 14, a radio-controlled timepiece 140 of the embodiment is a timepiece that includes the piezoelectric vibrator 30 electrically connected to a filter 141 and is capable of receiving a standard wave including time information to automatically correct the displayed time to the accurate time.

In Japan, there are two transmitting stations for transmitting a standard wave. One of the stations is located in Fukushima prefecture (40 kHz), and the other is located in Saga prefecture (60 kHz), which are transmitting respective standard waves. A long wave such as 40 or 60 kHz has a combination of the property of propagating on the surface of the Earth and the property of propagating while reflecting between an ionosphere and the surface of the Earth, providing a wide propagation range, so the whole of Japan is covered by the above-described two transmitting stations.

The functional configuration of the radio-controlled timepiece 140 is described below in detail.

An antenna 142 receives a standard wave of a long wave of 40 or 60 kHz. The standard wave of the long wave is formed by amplitude-modulating a carrier wave of 40 or 60 kHz by time information called time code. The received standard wave of the long wave is amplified by an amplifier 143 and filtered and tuned by the filter 141 including a plurality of piezoelectric vibrators 30.

The piezoelectric vibrator 30 of the embodiment includes crystal resonators 148, 149 having resonance frequencies of 40 and 60 kHz, respectively, which are the same as the carrier frequencies.

Furthermore, the filtered signal of a predetermined frequency is detected and demodulated by a detector/rectifier 144.

Then, a time code is extracted through a waveform shaper 145 and counted by a CPU 146. The CPU 146 reads information, such as the current year, current accumulated days, current day of the week and current time. The read information is reflected by an RTC 148 that shows accurate time information.

Since the frequency of the carrier wave is 40 or 60 kHz, a vibrator having the above-described tuning-fork type structure is suitable for the crystal resonators 148, 149.

Note that the above description is for the case in Japan. In other countries, a standard wave of a long wave is used at a different frequency. For example, in Germany, a standard wave of 77.5 kHz is used. So, in order to include in a mobile device the radio-controlled timepiece 140 that can be used in other countries, another piezoelectric vibrator 30 for a frequency different from that for Japan is additionally required.

According to the radio-controlled timepiece 140 of the embodiment, including the piezoelectric vibrator 30 capable of ensuring good drive level characteristics allows manufacturing of the radio-controlled timepiece 140 having good quality.

Note that the invention is not limited to the above-described embodiment.

In the embodiment, the piezoelectric vibration piece of the invention is used for the surface mount type piezoelectric vibrator. However, this is not a limitation. For example, the piezoelectric vibration piece of the invention may be used for a cylinder-package type piezoelectric vibrator.

What is claimed is:

1. A piezoelectric vibration piece comprising:
a pair of vibrating arms each having a distal end and a proximal end;
a base having the proximal ends of the vibrating arms connected thereto, the base and the pair of vibrating arms comprising portions of a crystal substrate;
a groove in each of the vibrating arms along a length thereof, wherein the groove has a first end toward the distal end and a second end toward the proximal end, and a width of the groove at the first end is greater than the width of groove at the second end,
wherein the base comprises a mount section and an intermediate section, where a width of the intermediate section is less than a width of the mount section, and the mount section and the intermediate section are connected by sloped side surfaces that are aligned with a crystal axis of the crystal substrate.

2. The piezoelectric vibration piece according to claim 1, wherein the groove includes a first portion at the first end having a constant width and a second portion integral with the first portion and having a width that is less than the constant width.

3. The piezoelectric vibrating piece according to claim 2, wherein the first portion has a length that is about twice as long as a length of the second portion.

4. The piezoelectric vibrating piece according to claim 2, wherein the width of the second portion tappers to a narrower width as the second portion extends toward the second end.

5. The piezoelectric vibrating piece according to claim 2, wherein the width of the second portion is constant.

6. The piezoelectric vibrating piece according to claim 1, wherein the second end of the groove in each vibrating arm is located in the base.

7. The piezoelectric vibrating piece according to claim 2, wherein the second end of the groove in each vibrating arm is located in the vibrating arm.

8. The piezoelectric vibrating piece according to claim 1, wherein the sloped side surfaces have a lateral angle of about 30 degrees to about 60 degrees with respect to a length direction of the piezoelectric vibrating piece.

9. The piezoelectric vibrating piece according to claim 8, wherein the lateral angle is about 45 degrees.

10. The piezoelectric vibrating piece according to claim 1, wherein a width of the proximal end of the vibrating arms is greater than a width of the distal end.

11. The piezoelectric vibrating piece according to claim 10, wherein the vibrating arms include a portion near the proximal end whose width increases towards the proximal end.

12. A piezoelectric vibration piece comprising:
a pair of vibrating arms each having a distal end and a proximal end;
a base having the proximal ends of the vibrating arms connected thereto, the base and the pair of vibrating arms comprising portions of a crystal substrate,
wherein the base comprises a mount section and an intermediate section, where a width of the intermediate section is less than a width of the mount section, and the mount section and the intermediate section are connected by sloped side surfaces that are aligned with a crystal axis of the crystal substrate.

13. The piezoelectric vibrating piece according to claim 12, wherein the sloped side surfaces have a lateral angle of about 30 degrees to about 60 degrees with respect to a length direction of the piezoelectric vibrating piece.

14. The piezoelectric vibrating piece according to claim 13, wherein the lateral angle is about 45 degrees.

15. A piezoelectric vibrator comprising the piezoelectric vibrating piece according to claim 1.

16. An oscillator comprising the piezoelectric vibrator according to claim 15.

17. A clock comprising the piezoelectric vibrator according to claim 15.

18. A filter comprising the piezoelectric vibrator according to claim 15.

\* \* \* \* \*